(12) United States Patent
Hata et al.

(10) Patent No.: US 6,550,136 B1
(45) Date of Patent: Apr. 22, 2003

(54) METHOD OF FABRICATING PRINTED WIRING BOARD

(75) Inventors: Hiroki Hata, Oume (JP); Kenichi Yamane, Nagano Prefecture (JP); Akihiro Nishimura, Nagano Prefecture (JP); Noriaki Taneko, Nagano Prefecture (JP)

(73) Assignee: Sumitomo Metal Mining Co., LTD, Tokyo (JP)

( * ) Notice: Subject to any disclaimer, the term of this patent is extended or adjusted under 35 U.S.C. 154(b) by 0 days.

(21) Appl. No.: 09/511,368

(22) Filed: Feb. 23, 2000

(51) Int. Cl.$^7$ ................................................. H05K 3/02
(52) U.S. Cl. ............................ 29/846; 29/831; 29/847
(58) Field of Search ........................... 29/846, 847, 831

(56) References Cited

U.S. PATENT DOCUMENTS

| | | | | |
|---|---|---|---|---|
| 4,830,554 A | * | 5/1989 | Lopez ........................... | 29/414 |
| 5,699,613 A | * | 12/1997 | Chong et al. ................ | 174/264 |
| 5,972,482 A | * | 10/1999 | Hatakeyama et al. ........ | 428/209 |
| 6,370,768 B1 | * | 4/2002 | Itabashi ....................... | 205/126 |

* cited by examiner

*Primary Examiner*—Joseph J. Hail, III
*Assistant Examiner*—Alvin J Grant
(74) *Attorney, Agent, or Firm*—Dykema Gossett, PLLC

(57) ABSTRACT

The present invention aims to provide a method of fabricating a printed wiring board characterized in that a printed wiring board is fabricated by perforating a slot by a router bit at a central part of a substrate. The method further includes cutting a wiring portion for electric plating by the router bit. According to the method, the occurrence of cut burr on the surfaces of the wiring pattern, caused by electric plating, is prevented, the product yield is promoted and the operational efficiency is improved. The invention also discloses a method of fabricating a printed wiring board by forming a conductor circuit by patterning a metal coating formed on a surface of an insulating substrate, successively subjecting the conductor circuit to a surface treatment by electric plating and thereafter perforating a slot by a router bit. The slot connects the substrate to a semiconductor chip at a central portion thereof by bonding wires. As per the method, a pattern of a wiring portion (a wiring pattern) for the electric plating at a location for perforating the slot is inclined at an acute angle relative to a face orthogonal to a moving direction of the router bit, preferably, an acute angle of approximately 15° or more and a width of the wiring portion for the electric plating being approximately 90 $\mu$m or more.

3 Claims, 3 Drawing Sheets

PROIR ART

PROIR ART

METHOD OF FABRICATING PRINTED WIRING BOARD

BACKGROUND OF THE INVENTION

1. Field of the Invention

The present invention relates to a method of fabricating a printed wiring board, particularly to a method of fabricating a printed wiring board having a slot for a bonding wire for connecting with a semiconductor chip at its central portion.

2. Description of the Related Art

As an example of a conventional method of fabrcating a printed wiring board, conventionally, a printed wiring board is fabricated by using a copper-clad glass epoxy resin substrate formed of a glass epoxy resin having a copper coating on a surface thereof. Such a copper-clad glass epoxy resin substrate is provided by a method in which a copper foil previously coated with an adhesive agent on a bonding face thereof is pasted on a glass epoxy resin board produced by impregnating epoxy resin in glass fabrics, or by a method in which a glass epoxy resin prepreg and a copper foil are subjected to thermal compression bonding.

A copper foil used as a copper coating layer formed on this kind of a copperlad glass epoxy resin substrate is an electrolytic copper foil having a thickness of about 9 $\mu$m to 35 $\mu$m.

However, since printed wiring boards are used widely in apparatus for domestic use such as television sets, cameras and in various kinds of industrial apparatus such as computers, high density wiring is needed. As a result, thin wall formation of a copper coating layer has been requested in order to accurately form fine patterned circuits. Therefore, according to the copperclad glass epoxy resin substrate, in accordance with the thin wall formation of the copper coating layer, a method of forming a copper coating by electroless plating has been developed. Further, as a method of fabricating a printed wiring board by using such a copper-clad glass epoxy resin substrate, a semi additive process or a subtractive process has generally been used.

The semi additive process is a process in which a conductor circuit is formed on the copper coating layer on the copper-clad glass epoxy resin substrate by plating, and specifically a metal coating formed on the copperciad glass epoxy resin substrate provides a first metal layer and a plating resist layer is formed thereon according to a predetermined pattern.

In this case, a thickness of the plating resist layer is made to be equal to or larger than a thickness of a circuit formed on the first metal layer by a plating process. Successively, a plate coating (second metal layer) is formed on the metal coating (first metal layer) exposed among intermediate portions of the pattern of the plating resist layer by an electric plating process. Thereafter, the plating resist layer is exfoliated, a face of the metal coating (fust metal layer) is exposed and the exposed metal coating (first metal layer) is removed by etching with the electrically-plated coating (second metal layer) as a mask to thereby form the conductor circuit.

The subtractive process is a process in which a conductor circuit is formed by removing a copper coating layer from the copper-clad glass epoxy resin substrate, and specifically an etching resist layer is provided on the copper coating formed on the copper-clad glass epoxy resin substrate and is formed in a pattern indicating a region necessary for the circuit. Successively, a conductor circuit pattern is formed by dissolving to remove the exposed metal coating region and thereafter, the resist layer is exfoliated to thereby fabricate a printed wiring board. According to the printed wiring board provided by these processes, in comparison with a conventional printed wiring board prepared by using the copper-clad glass epoxy resin substrate fabricated by the copper foil as its material, wirings having a high density can be provided.

Further, the following process is carried out thereafter on a conductor circuit portion of the printed wiring board prepared as described above.

That is, after roughening the conductor circuit portion in order to promote adhesion thereof with a solder resist, provided later, the solder resist is coated or laminated, a bump pad portion is expose at a central portion by exposing and developing the solder resist layer, the resist layer remaining at a surrounding portion is thermally harlened, and thereafter the bump pad portion is electrically plated Further, the printed wiring board formed as described above is provided with a shape as shown in FIG. 5. The printed wiring board is constructed such that bump pads 14 for connecting to electrode pads 13 of a semiconductor chip 12 are aligned in arrays at peripheral portions of a printed wiring board 11 and the electrode pads 13 of the semiconductor chip 12 are connected to the bump pads 14 by bonding wires 15, as illustrated in FIG. 6. Further, there is formed a semiconductor package of PBGA molding the printed wring board 11 and the semiconductor chips 12 connected as described above by a resin 16 or TSGA integrating tape substrate on which the wiring is provided and the semiconductor chips 12 by a cover plate, as required.

However, for conventional printed wiring boards arranged with the bump pads aligned in arrays at the peripheral portions of the printed wiring substrate, the electrode pads of the semiconductor chip are connected to the bump pads at the peripheral portions of the printed wiring substrate by bonding wires. Accordingly, a wiring length of the bonding wires must be relatively long and thus the conventional printed wiring board cannot be used for a conductor circuit having a higher density or high frequency, as now in demand. Hence, in order to shorten the wiring length, there has been proposed a printed wiring board formed by perforating a slot using a router bit, the slot being connected to a semiconductor chip by bonding wires at a central portion of a printed wiring substrate and meanwhile, arranging bump pads at vicinities of the slot and including bonding wires for connecting to electrode pads of semiconductor chips to the slot.

According to the printed wiring board of this type, the conductor circuit is formed by the semi additive process or the subtractive process by using the copper-clad glass epoxy resin substrate. Successively, a surface treatment is carried out on the conductor circuit by electric plating, and thereafter a slot is provided at the central portion of the substrate by the router bit. The pattern of the wiring portion of the conductor circuit on the printed wiring substrate is formed orthogonally relative to a moving direction of the router bit. The wiring pattern of the conductor circuit is simultaneously cut when the slot is perforated.

However, when the slot is perforated by the router bit, cut burr is produced at cut surfaces of the wiring portion formed orthogonally to a moving direction of the router bit. When the burr is large such that it will project towards an area of slot, and when the pattern is pulled by the router bit and causes exfoliation of the wiring during cutting the wiring pattern, the printed wiring board becomes unusable, and when the burr is small, the burr must be removed by vacuum suction or the like. Therefore, time and labor are required, the product yield is reduced and the production efficiency is lowered. Further, when the burr is not completely removed, short circuiting between the wires can occur.

SUMMARY OF THE INVENTION

It is an object of the invention to provide a method of fabricating a printed wiring board so as to prevent cut burr from being produced at cut surfaces of the wiring pattern during cutting the wiring pattern, and simultaneously preventing peel off of the wiring, whereby the product yield is promoted and the operational efficiency is improved.

In order to achieve the above-described object, according to an aspect of the invention, the present invention provides a method of fabricating a printed wiring board. The method includes the steps of forming a conductor circuit by patterning a metal coating formed on a surface of an insulating substrate, successively subjecting the conductor circuit to a surface treatment by electric plating, and thereafter perforating a slot for bonding wires for connecting to a semiconductor chip at a central portion of the substrate by a router bit. According to the method described above, a pattern of a wiring portion constructed of the conductor circuit at a location for perforating the slot is inclined to at an acute angle relative to a face orthogonal to a moving direction of the router bit, preferably, an acute angle of approximately 15° or more. Moreover, for the method described above, a width of the wiring portion for the electric plating is approximately 90 μm or more, preferably, 120 μm or more.

DETAILED DESCRIPTION OF THE PREFERRED EMBODIMENTS

According to the invention, in addition to a general copperdad glass epoxy resin substrate, a copper-clad glass epoxy resin substrate formed with a conductor circuit by using the above-described semi additive process, a subtractive process or a full additive process can also be used.

Specifically, in forming or prior to forming a metal coating by electroless plating, palladium, silver or an alloy including these is used on a surface of the copperhead glass epoxy resin as a plating catalyst.

Further, when the conductor circuit is formed by using the semi additive process or the subtractive process, after forming the metal coating on the surface of the glass epoxy resin by a plating process using the catalyst, a portion of the metal coating is removed by etching to thereby form the conductor circuit on the surface of the glass-epoxy resin.

Further, when the conductor circuit is formed by using the fill additive process, the metal coating is formed on the surface of the glass epoxy resin and adsorbed with the catalyst and exposed among intermediary portions of the circuit after removing a plating resist layer.

Further, a conductor circuit portion formed on an insulating substrate in this way is roughened by, for example, chemical polishing, buffing orjet scrubbing (abrasive grain blowing) in order to promote adhesion with solder resist, provided later. Successively, after coating a solder resist over the entire surface of the printed wiring board by coating or laminating, the solder resist layer is removed by exposing and developing to thereby expose a bump pad portion at a central portion of the substrate. Successively, after thermally hardening a solder resist layer remaining at peripheral portions of the printed wiring board, NiAu or Au plating is carried out on the exposed bump pad portion by electric plating process.

Figure 1:
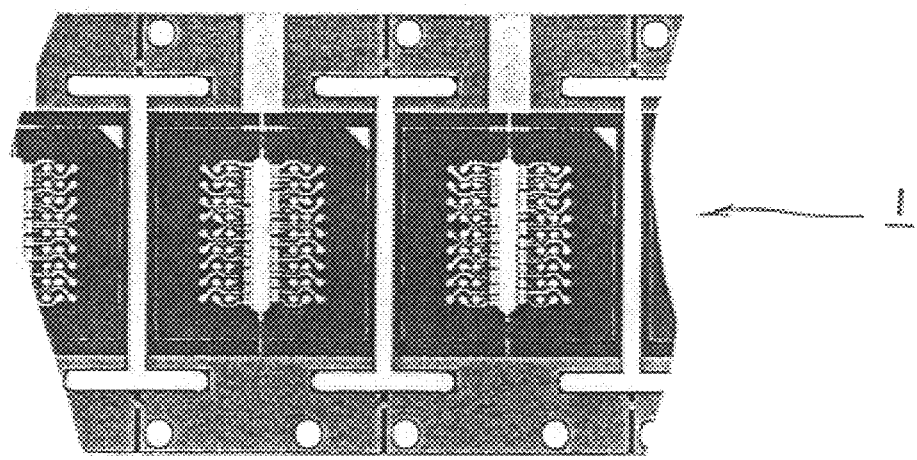
FIG. 1 is a plan view of a printed wiring board fabricated by the invention.

Although the printed wiring board shown in FIG. 1 can be fabricated by perforating a slot at a central portion of the printed wiring board formed in this way by a router bit and arranging bump pads at vicinities of the slot, in perforating the slot, a pattern of a wiring portion provided at the central portion of the substrate for electric plating needs to be cut by the router bit and in this case, a consideration must be given to sufficiently prevent the occurrence of cut burr.

Hence, the inventors have carried out various research in order to prevent the occurrence of cut burr in cutting the pattern of the wiring portion for electric plating by the router bit. As a result, the inventors have completed the invention by finding out that not only the occurrence of burr, with respect to but also exfoliation of wiring can be efficiently prevented by forming a constant angle in respect of the pattern of the wiring portion and making a wiring width equal to or larger than a predetermined width.

Figure 2:
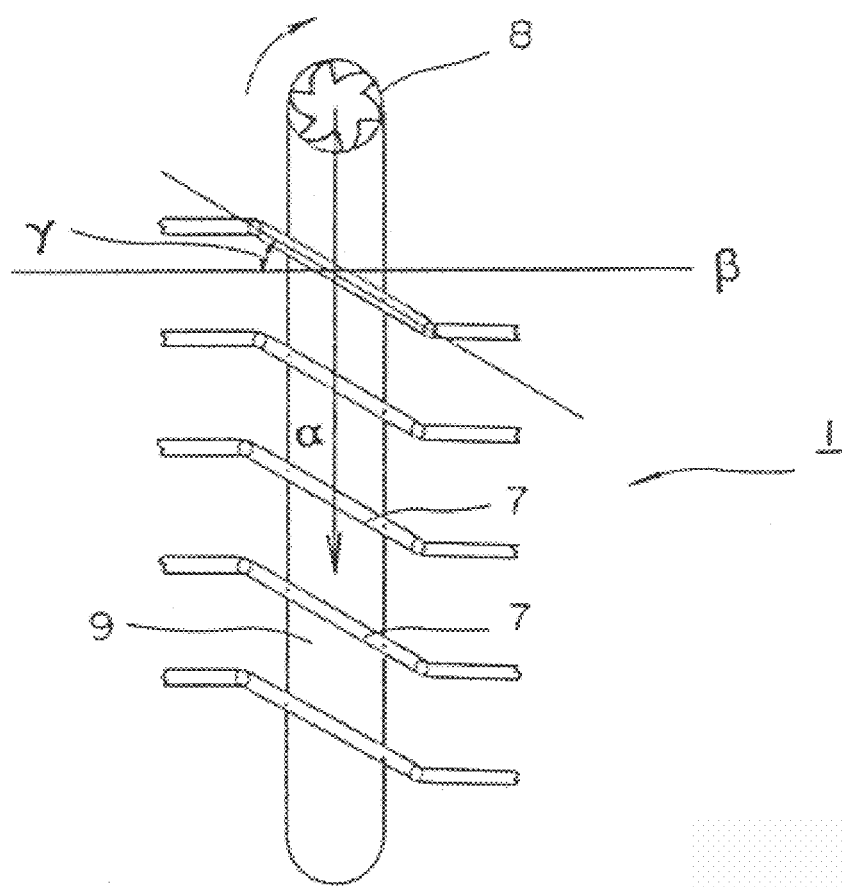
FIG. 2 is plan view of a slot being perforated

Specifically, it has been found that occurrence of burr is significantly reduced when a pattern 7 of a wiring portion for electric plating formed on a printed wiring board 1 is formed such that an angle γ relative to a face β orthogonal to a moving direction α of a router bit 8 is previously formed to incline by an acute angle, preferably, an acute angle of approximately 15° or more, further preferably, about 30° as shown in FIG. 2. In other words, the reason of making the angle y of the pattern of the wiring portion relative to the face β orthogonal to the moving direction ax of the router bit 8, 15° or more, is that when the angle γ is made to be less than 15° or an obtuse angle, an amount of burr produced by the router bit 8 becomes significantly large. Further, although the larger the angle γ relative to the face β orthogonal to the moving direction α of the router bit 8, the more preferable, there is a restriction on the width of the sheet and therefore, the upper limit is at least about 60°.

Further, it has been found that according to the wiring pattern, when the width of the wiring portion is less than 90 μm, exfoliation of wirings in fabrication is caused by pulling the wiring pattern when an extensive amount of material is perforated by the router bit 8. Furthermore, burr caused by the exfoliation of wirings may also occur. That is, the cxfoliation of wirings in fabrication can be prevented in the case of the wiring pattern for electric plating having a width of approximately 90 μm of more, preferably, approximately 120 μm or more.

Further, it is preferable to make the width of the wiring portion 200 μm or less in consideration of a request for higher density formation although the width differs depending on dimensions of the substrate of the wiring.

Figure 3:
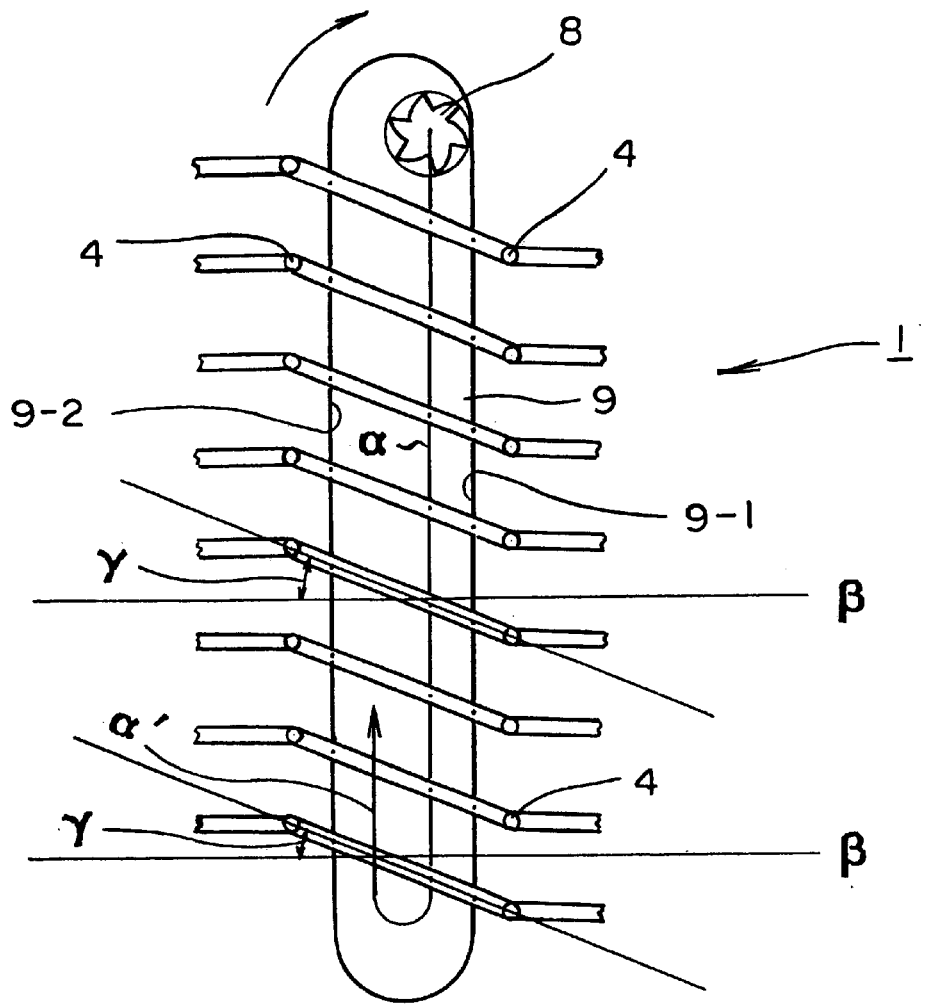
FIG. 3 is a plan view of a slot being reciprocated and perforated.

Generally, a method for forming the slot includes cutting by router bit 8, as illustrated in FIG. 2. Specifically, the method includes perforating by the router bit 8 having the same width as the slot 9, wherein both side faces of the slot 8 are cut in the moving direction a of the bit while rotating the bit 8 in one direction, as shown in FIG. 3. Referring to FIG. 3, one side face 9-1 of the slot 9 is cut to perforate in the moving direction a of the bit 8, which has a smaller diameter than the width of the slot to be perforated, while rotating the bit 8 in one direction. Successively, at a stage at which cutting of a predetermined length of the slot 9 is finished, the moving direction ox of the bit 8 is switched to a reverse direction and the bit 8 is moved in a moving direction α and other side face 9-2 of the slot 9 is cut to perforate to thereby form the desired slot 9. In either of the cases, the wiring pattern is disposed such that the angle γ relative to the face β orthogonal to the moving direction a of the router bit 8 becomes an acute angle, and the wiring pattern is inclined.

Furthermore, in the latter case, the width of slot 9 can be widened without using the router bit 8 of a different diameter. This can be done by increasing the number of reciprocal movements, by repeating the operation of switching the moving direction as required. Further, kinds of the router bit 8 used, a rotational number, inserting and discharging speed, feed speed and the like of the router bit 8 are not particularly limited but preferable ones can be selected in accordance with the shape of the slot 9 to be perforated.

Figure 4:
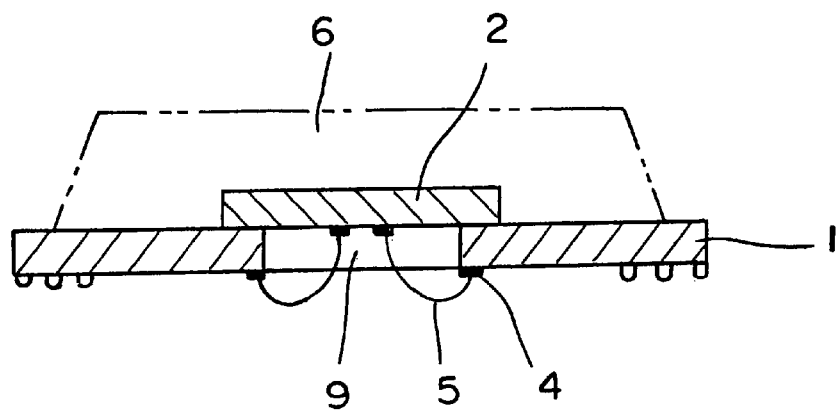
FIG. 4 is an outline sectional view of PBGA fabricated by using an embodiment of a printed wiring board according to the invention.
Figure 5:
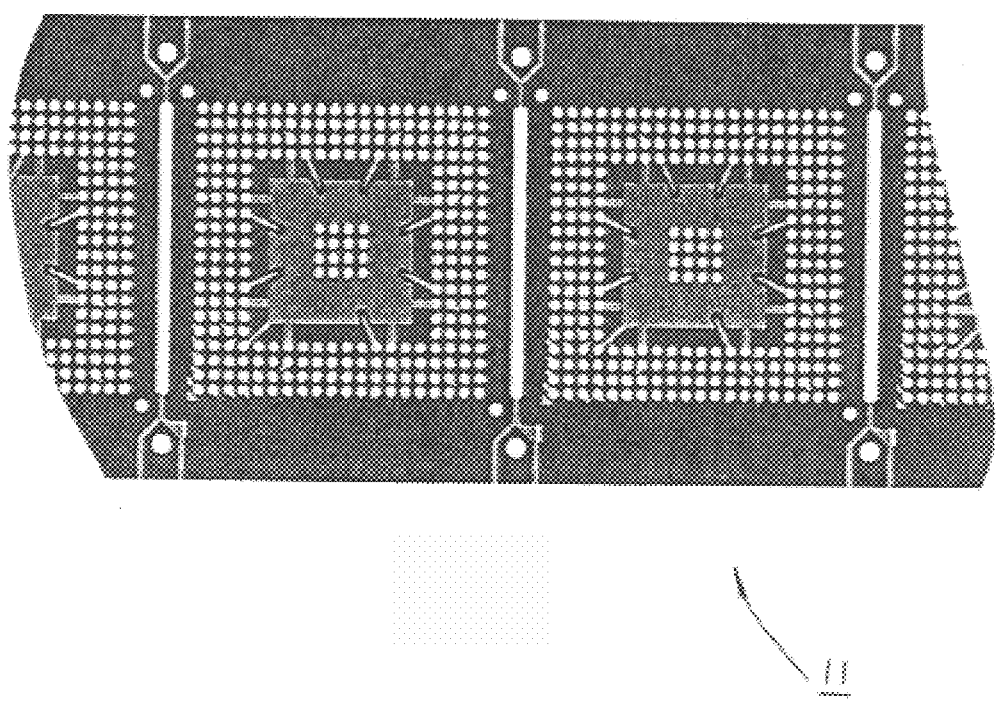
FIG. 5 is a plan view of a conventional printed wiring board.
Figure 6:
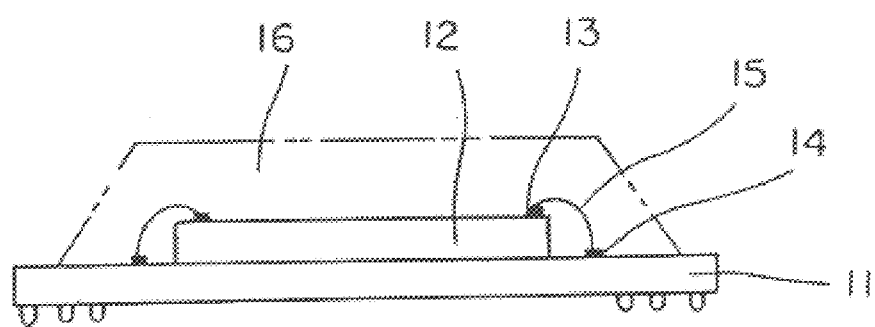
FIG. 6 is an outline sectional view of PBGA fabricated by using the printed wiring board according to a conventional technology.

According to a printed wiring board perforated with the slot 9 at its central portion in this way and arranged with bump pads 4 at vicinities of the slot 9, the bump pads 4 and electrode pads 3 of a semiconductor chip 2 are connected by bonding wires 5 as shown in FIG. 4. Further, there can also be constituted a semiconductor package of PBGA produced by molding the printed wiring board 1 and the semiconductor chip 2 which are connected to each other by a resin 6 or TBA produced by integrating the printed wiring board 1 and the semiconductor chip 2 by a cover plate as required Next, an explanation will be given of embodiments according to the invention along with comparative examples.

A dry film type photoresist "AQ2559" (commercial name) made by Asahi Chemical Industry is uniformly laminated to a thickness of 25 μm on a surface of a copper-clad glass epoxy resin substrate having a thickness of 200 gm provided with a copper foil of 18 μm. Thereafter, a photomask on which the conductive circuits are patterned to provide a circuit width and a circuit interval of 40 μm is mounted on the photoresist layer, ultraviolet ray of 60 rnJ/cm$^2$ is irradiated thereon and successively, the substrate is developed, washed by water and dried to thereby prepare a printed writing board formed with a conductor circuit.

Next, after roughening the conductor circuit portion by blowing abrasive grains having a particle diameter of 100 μm, a solder resist "PS R4000AUS" (commercial name), made by Taiyo Ink, is coated thereon to a thickness of 30 μm. Successively, the solder resist is dissolved to be removed by exposure and development, to thereby expose a bump pad portion at a central portion thereof Thereafter, the solder resist remaining at peripheral portions is thermally hardened by a drying furnace.

Successively, after having a surface treatment by performing electric plating, an electric plating operation and perforating operation are performed by a router bit with respect to a pattern of a wiring portion for the electric plating while varying a pattern width of the wiring portion and the angle (γ) relative to a face orthogonal to a moving direction of the router bit as shown in Table 1. An occurrence state of burr is shown in Table 1 and an occurrence state of exfoliation of wiring is shown in Table 2.

Further, perforating conditions by the router bit are as follows.
(1) Router bit: bit made by Union Tool
(2) Spindle Speed of bit: 38000 rpm (rotated in the clockwise direction)
(3) Z axsis advance: 100 mm/min
(4) Feed speed of bit: 350 to 400 mm/min (bit is moved only in one direction)
(5) Width and length of slot: 1.0 mmW×10.00 mmL

TABLE 1

| Pattern width of | Angle γ (°) | | | | |
|---|---|---|---|---|---|
| wiring portion (μm) | −30 | −15 | 0 | +15 | +30 |
| 70 | x | ○ | ○ | ○ | φ |
| 90 | x | ○ | ○ | ○ | φ |
| 115 | x | x | ○ | φ | φ |
| 130 | x | x | x | φ | φ |

φ: No occurrence of burr
○: Almost no occurrence of burr
x: Occurrence of burr

As is apparent from Table 1, even when the pattern width of the, wiring portion is varied, in the case in which the angle (γ) relative to the face orthogonal to the moving direction of the router bit is inclined to be 15° or more, occurrence of burr can be prevented and particularly, burr does not occur at an inclination of 30°.

TABLE 2

| Pattern width of | Angle γ (°) | | | | |
|---|---|---|---|---|---|
| wiring portion (μm) | −30 | −15 | 0 | +15 | +30 |
| 70 | x | x | x | x | ○ |
| 90 | x | x | x | ○ | φ |
| 115 | φ | φ | φ | φ | φ |
| 130 | φ | φ | φ | φ | φ |

φ: No exfoliation of wiring
○: Almost no exfoliation of wiring
x: Exfoliation of wiring As is apparent from Table 2, when the pattern width of the wiring portion is made to be 90 μm or more, exfoliation of wiring can be prevented and particularly, exfoliation of wiring does not occur in the case of the pattern width of 120 μm or more.

It is known from the results shown in Table 1 and Table 2 that conditions of no occurrence of burr and no exfoliation of wiring are constituted by forming the wiring pattern of the wiring portion for electric plating to be inclined at an acute angle of approximately 15° or more relative to the face orthogonal to the moving direction of the router bit, and making the width of the wiring portion approximately 90 μm or more.

As has been described, there can be provided a method of fabricating a printed wiring board Specifically, the method includes fabricating a printed wiring board by perforating a slot by a router bit and in which in cutting a pattern of a wiring portion for electric plating by the router bit, occurrence of burr is prevented, occurrence of exfoliation of wiring is also prevented, the product yield is promoted and the operational efficiency is improved.

What is claimed is:

1. A method of fabricating a printed wiring board, said method comprising the steps of:

forming a conductor circuit by patterning a metal coating formed on a surface of an insulating substrate;

subjecting the conductor circuit to a surface treatment by electric plating; and perforating a slot using a router bit, said slot being connected to a semiconductor chip by bonding wires at a central portion of the substrate, wherein a pattern of a wiring portion of said conductor circuit at a location for perforating the slot is inclined at an acute angle relative to a face orthogonal to a moving direction of the router bit.

2. The method of fabricating a printed wiring board according to claim 1:

wherein the pattern of the wiring portion for the electric plating is inclined at an acute angle of approximately 15° or more relative to the face orthogonal to the moving direction of the router bit.

3. The method of fabricating a printed wiring board according to claim 1:

wherein a width of the pattern of the wiring portion for the electric plating is approximately 90 $\mu$m or more.

* * * * *